United States Patent
Emira et al.

(10) Patent No.: US 10,491,233 B1
(45) Date of Patent: Nov. 26, 2019

(54) SAR ADC HAVING ACCURATE SPLIT CAPACITOR

(71) Applicant: GOODIX TECHNOLOGY INC., San Diego, CA (US)

(72) Inventors: Ahmed Emira, San Diego, CA (US); Mohamed Aboudina, San Diego, CA (US)

(73) Assignee: SHENZHEN GOODIX TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 15/993,627

(22) Filed: May 31, 2018

(51) Int. Cl.
  *H03M 1/46* (2006.01)

(52) U.S. Cl.
  CPC ............ *H03M 1/466* (2013.01); *H03M 1/462* (2013.01)

(58) Field of Classification Search
  CPC .............................. H03M 1/462; H03M 1/466
  USPC .................................................... 341/150–161
  See application file for complete search history.

(56) References Cited

U.S. PATENT DOCUMENTS

| | | | | |
|---|---|---|---|---|
| 7,786,907 | B2 * | 8/2010 | Monro | H03M 7/30 341/107 |
| 7,961,132 | B1 * | 6/2011 | Perry | H03M 1/0607 341/155 |
| 9,654,131 | B1 * | 5/2017 | Fuchs | H03M 1/1038 |
| 2003/0197636 | A1 | 10/2003 | Confalonieri et al. | |
| 2004/0233093 | A1 * | 11/2004 | Confalonieri | H03M 1/0682 341/172 |
| 2007/0236380 | A1 * | 10/2007 | La Rue | H03M 1/1245 341/155 |
| 2010/0007539 | A1 * | 1/2010 | Hu | H03M 1/68 341/150 |
| 2010/0039303 | A1 | 2/2010 | Tsukamoto | |
| 2011/0084866 | A1 * | 4/2011 | Hsu | H03M 1/16 341/156 |
| 2012/0001781 | A1 * | 1/2012 | Scanlan | H03M 1/1004 341/110 |
| 2012/0075128 | A1 | 3/2012 | Aruga et al. | |
| 2013/0076553 | A1 * | 3/2013 | Kuo | H03M 1/466 341/172 |

(Continued)

FOREIGN PATENT DOCUMENTS

| CN | 102244067 A | 11/2011 |
|---|---|---|
| CN | 103583002 A | 2/2014 |

(Continued)

OTHER PUBLICATIONS

International Search Report dated Mar. 6, 2019 in the corresponding PCT application (application No. PCT/CN2018/116966).

(Continued)

*Primary Examiner* — Lam T Mai
(74) *Attorney, Agent, or Firm* — Kilpatrick Townsend & Stockton LLP (57) ABSTRACT

An array of capacitors includes a first array of k capacitors coupled to a first node and having capacitances which are binary weighted multiples of a unit capacitance value, a second array of m capacitors coupled to a second node and having capacitances which are binary weighted multiples of the unit capacitance value, a coupling capacitor disposed between the first node and the second node, and a trimmable grounded capacitor coupled between the first node and a ground potential.

13 Claims, 7 Drawing Sheets

(56) References Cited

U.S. PATENT DOCUMENTS

| | | |
|---|---|---|
| 2014/0285370 A1 | 9/2014 | Miki et al. |
| 2016/0119522 A1* | 4/2016 | Choi ..................... G06F 3/042 |
| | | 348/302 |
| 2016/0134300 A1* | 5/2016 | Wang ................. H03M 1/0854 |
| | | 341/172 |
| 2017/0302288 A1 | 10/2017 | Huang |
| 2018/0269893 A1* | 9/2018 | Chang ................ H03M 1/0682 |

FOREIGN PATENT DOCUMENTS

| | | |
|---|---|---|
| KR | 101299215 B1 | 8/2013 |
| KR | 20160084686 A | 7/2016 |

OTHER PUBLICATIONS

EP Search Report dated Jul. 10, 2019 in the corresponding EP application (application No. 18849454.6).

* cited by examiner

SAR ADC HAVING ACCURATE SPLIT CAPACITOR

FILED OF THE INVENTION

The present invention relates to successive approximation analog-to-digital converters (SAR ADC), and more particularly, to a split capacitor array in a digital-to-analog conversion portion of an SAR DAC.

BACKGROUND OF THE INVENTION

Figure 1:
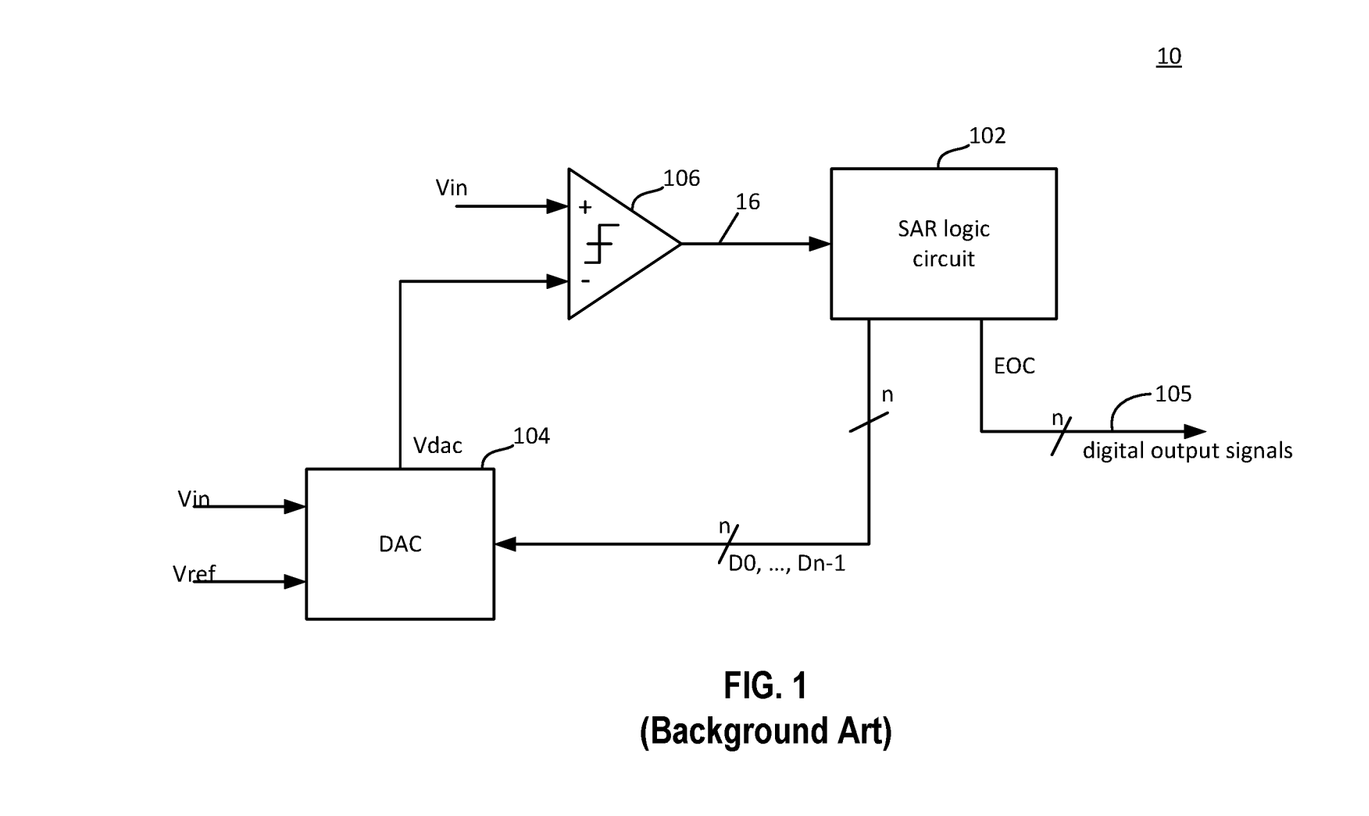
FIG. 1 is a block diagram of an example n-bit SAR DAC 10 that can be applied to embodiments of the present invention.

FIG. 1 is a block diagram of an example n-bit SAR DAC 10 that may be applied to embodiments of the present invention. The SAR DAC 10 includes a successive approximation register (SAR) logic circuit 102, a digital-to-analog converter (DAC) 104, and a voltage comparator 106. The DAC 104 weights an analog input signal Vin according to n digital data bits (D0, . . . , Dn−1) from the SAR logic circuit 102 and generates an analog output signal Vdac. The comparator 106 compares the analog output signal Vdac to an analog input signal Vin and provides a comparison result 16 to the SAR logic circuit 102. The SAR logic circuit 102 processes the comparison result successively in accordance with well-known successive approximation principles and outputs the digital output signals in a parallel form or in a serial form. The successive approximation process may be the following: the MSB bit is first initialized as 1, which is converted to an analog output signal Vdac by the DAC 104. The comparator 106 compares the signal Vdac to the analog input signal Vin, if Vin>Vdac, the MSB bit is set (logic 1 or high logic), if not, the MSB bit is set to 0 (zero or low logic), the next highest (MSB-1) bit is then set and the process repeats until the LSB bit is tested. The SAR logic circuit 102 then outputs digital output signals 105 after the end of the conversion (EOC) in a parallel form or in a serial form.

Figure 2:
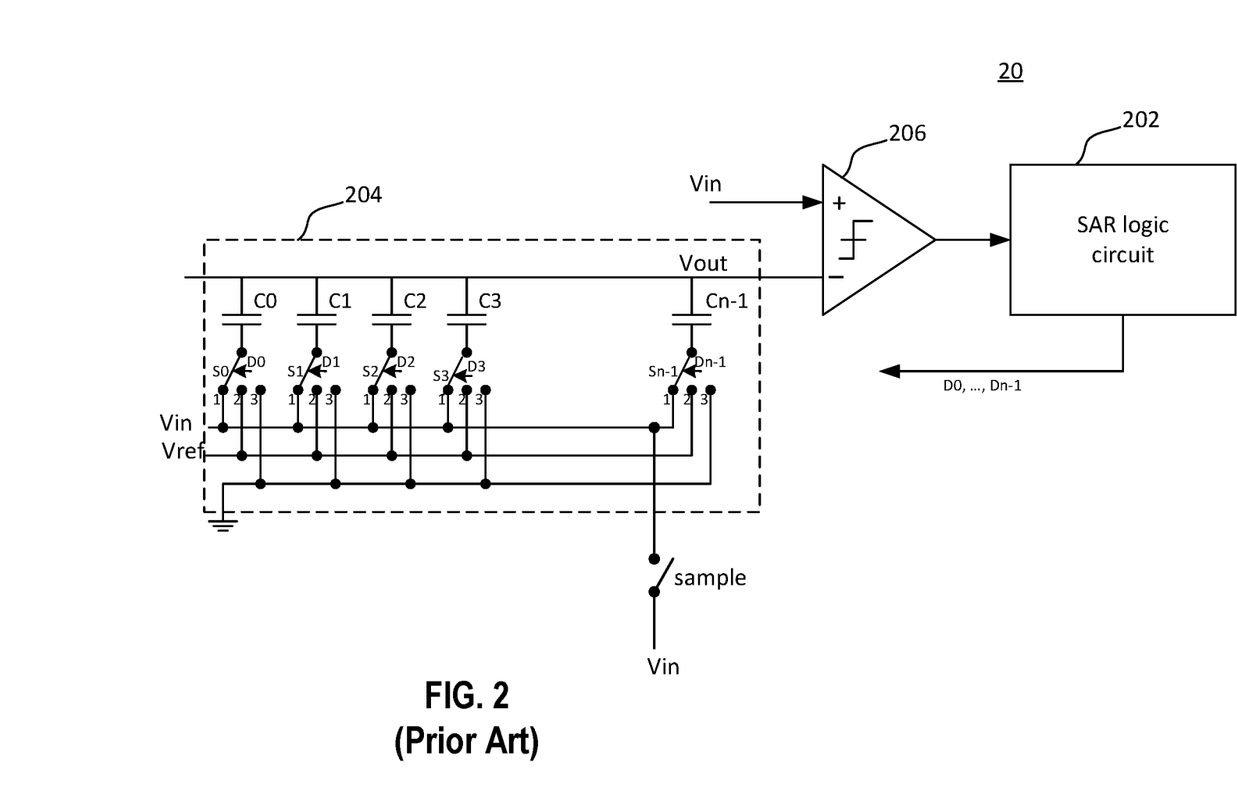
FIG. 2 is a conventional an n-bit SAR ADC including a binary weighted capacitor array DAC, as known in the art.

FIG. 2 is a conventional n-bit SAR ADC 20 including a binary weighted capacitor array DAC 204. Referring to FIG. 2, the binary weighted capacitor array DAC 204 includes a plurality of binary weighted capacitors C0, . . . , Cn−1, which are connected to the input voltage signal Vin for sampling. For example, if C0 is a capacitor having a unity capacitance value C, C1=2C, C2=4C, C3=8C, . . . , Cn−1=$2^{n-1}$ C. The n-bit SAR ADC 20 also includes n switches S0, S1, S2, . . . , Sn−1, where n equals to the number of weighted capacitors in the binary weighted capacitor array. Each of the n switches controls the connection of a respective capacitor to a reference voltage Vref, to an input voltage Vin, or to a ground potential. During the sampling phase, the n switches are in position 1 and the n capacitors are connected to the input voltage Vin. During the holding phase and conversion phase, the n switches are either in position 2 or 3 in accordance with their respective digital data bits. For example, for the first switch S0, if its data bit D0 is a logic 0, the switch S0 is in position 3, and if the data bit D0 is a logic 1, the switch S0 is in position 2. Thus, the inputs to each of the capacitors C0 to Cn−1 is a binary weighted representation of the reference voltage Vref.

This implementation of the n-bit SAR ADC has significant drawbacks. For SAR ADC converters with high bit resolutions, the ratio between the MSB capacitor (i.e., Cn−1) and the LSB capacitor (i.e., C0) increases exponentially with the number of bits (i.e., resolution) due to the binary scaling. Further, the large capacitance value increases the silicon area needed for the weighted capacitor array, and the input capacitance during the sampling phase of operation. For example, the input capacitance of this implementation during the sampling phase is the sum of all n capacitors C0 to Cn−1 (i.e., C+2C+4C+ . . . +$2^{n-1}$ C). Further, an n-bit SAR ADC requires that the MSB capacitor Cn−1 is $2^{n-1}$ times the value of the unit capacitor C. For example, a 10-bit SAR ADC requires that the MSB capacitor is 1023 times of the value of the unit capacitor. The large ratio between the unit capacitor and the MSB capacitor becomes too large to the point that its implementation is no longer feasible.

Thus, there is a need for a novel circuit and method to reduce the input capacitance and the silicon area that increase exponentially with the number of bits.

BRIEF SUMMARY OF THE INVENTION

According to one aspect of the present invention, an array of capacitors includes a first array of k capacitors coupled to a first node and having capacitances which are binary weighted multiples of a unit capacitance value, a second array of m capacitors coupled to a second node and having capacitances which are binary weighted multiples of the unit capacitance value, a coupling capacitor disposed between the first node and the second node, and a trimmable grounded capacitor coupled between the first node and a ground potential.

According to another aspect of the present invention, an n-bit analog-to-digital converter (ADC) includes an array of capacitors configured to receive an analog input signal and output an analog output signal, a comparator coupled to the array of capacitors and configured to provide a digital comparison result in response to the analog output signal, a successive approximation register (SAR) logic circuit configured to receive the digital comparison result and provide a plurality of digital data signals to the array of capacitors. The array of capacitors includes a first array of k+1 capacitors coupled to a first node and having capacitances which are binary weighted multiples of a unit capacitance value, a second array of m capacitors coupled to a second node and having capacitances which are binary weighted multiples of the unit capacitance value, a coupling capacitor disposed between the first node and the second node, and a grounded capacitor coupled between the first node and a ground potential. The variables k, m, and n being integers, and k+m=n.

According to yet another aspect of the present invention, a method of analog-to-digital signal conversion includes providing a first array of k capacitors coupled to a first node and having capacitances which are binary weighted multiples of a unit capacitance value, providing a second array of m capacitors coupled to a second node and having capacitances which are binary weighted multiple of the unit capacitance value, coupling the first node and the second node by a coupling capacitor, and coupling first node to a ground potential by a ground capacitor.

In one embodiment, the method further includes trimming the grounded capacitor so that a combination of the coupling capacitor and the trimmed grounded capacitor has a capacitance value equal to the unit capacitance value.

The following description, together with the accompanying drawings, will provide a better understanding of the nature and advantages of the claimed invention.

BRIEF DESCRIPTION OF THE DRAWINGS

The accompanying drawings form a part of the present disclosure, that describe exemplary embodiments of the present invention. The drawings together with the specification will explain the principles of the invention.

DETAILED DESCRIPTION OF THE INVENTION

In the following description, numerous specific details are provided for a thorough understanding of the present invention. However, it should be appreciated by those of skill in the art that the present invention may be realized without one or more of these details. In other examples, features and techniques known in the art will not be described for purposes of brevity.

It will be understood that the drawings are not drawn to scale, and similar reference numbers are used for representing similar elements. Embodiments of the invention are described herein with reference to functional block diagrams that are schematic illustrations of idealized embodiments (and intermediate structures) of the invention.

As used herein, the terms "a", "an" and "the" may include singular and plural references. It will be further understood that the terms "comprising", "including", having" and variants thereof, when used in this specification, specify the presence of stated features, steps, operations, elements, and/or components, but do not preclude the presence or addition of one or more other features, steps, operations, elements, components, and/or groups thereof. In contrast, the term "consisting of" when used in this specification, specifies the stated features, steps, operations, elements, and/or components, and precludes additional features, steps, operations, elements and/or components. Furthermore, as used herein, the words "and/or" may refer to and encompass any possible combinations of one or more of the associated listed items.

It should be noted that the reference numerals and letters denoted similar items in the accompanying drawings, and therefore, once an item is defined in a drawing, its description will not be repeated in drawings that follow.

Figure 3:
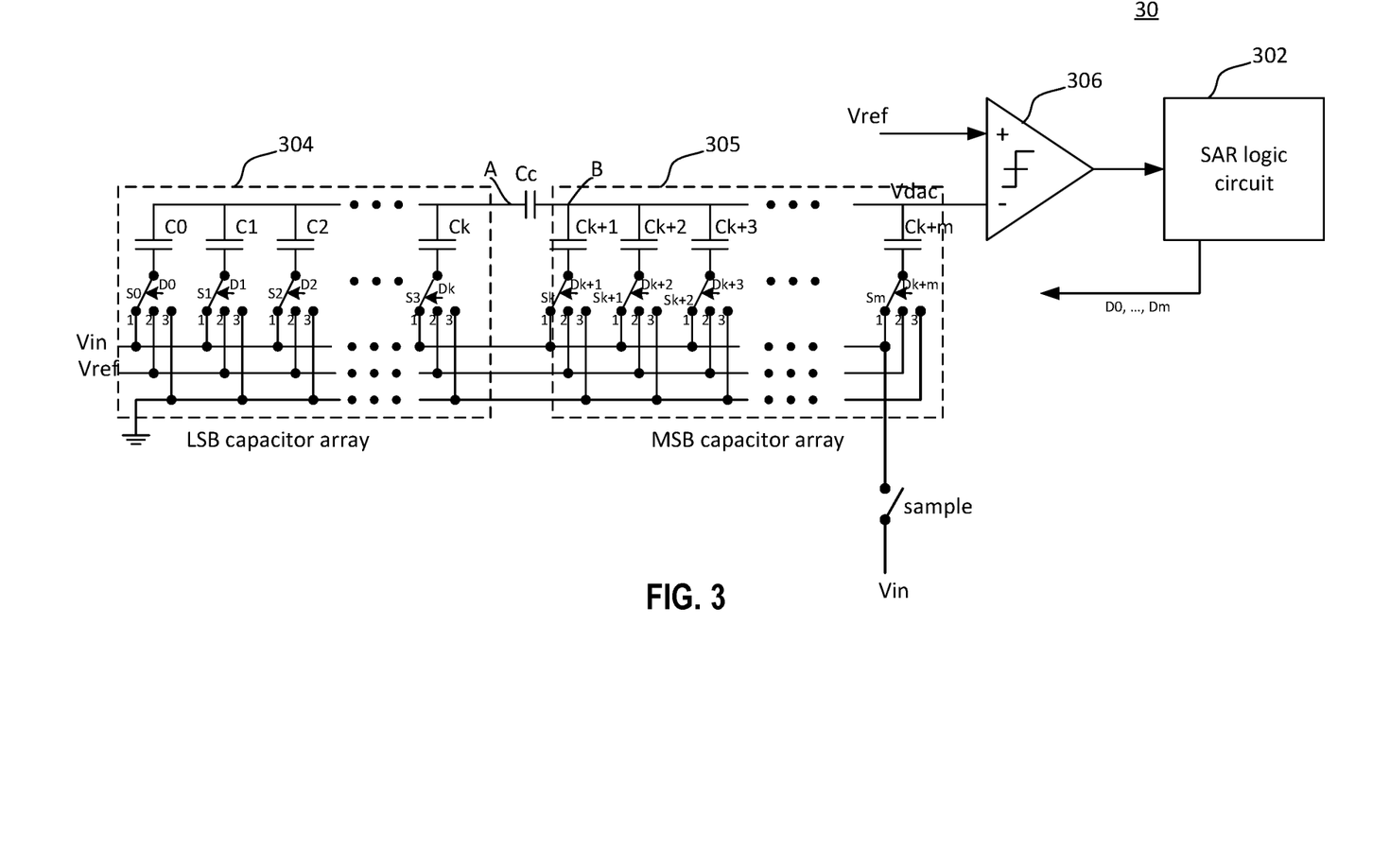
FIG. 3 is a block diagram of an n-bit SAR ADC converter that may be used to describe embodiments of the present invention.

FIG. 3 is a block diagram of an n-bit SAR ADC converter 30 that may be used to describe embodiments of the present invention. Referring to FIG. 3, a coupling capacitor Cc is introduced into the capacitor array of FIG. 2 to divide the capacitor array into two small capacitor arrays, an LSB capacitor array 304 and an MSB capacitor array 305. The coupling capacitor Cc has a capacitance value equal to the capacitor C0, which has a unit capacitance value C. As shown in FIG. 3, the LSB capacitor array 304 has k+1 (from C0 to Ck) capacitors, and the MSB capacitor array 305 has m (from k+1 to k+m) capacitors, where k and m are integers. The capacitors in the LSB capacitor array 304 and in the MSB capacitor array 305 are binary weighted. That is, C0=C, C1=2C, C2=4C, . . . , Ck=$2^k$C, and Ck+1=C0=C, Ck+2=C1=2C, . . . , and Ck+m=$2^m$C. There are two options for the design of the LSB capacitor array 304. In one embodiment, in the event that the n-bit SAR DAC converter 30 has an even number of bits, k represents an even number, and m represents an odd number. The LSB capacitor array 304 has an odd numbered k+1 of weighted capacitors and the MSB capacitor array has an odd numbered m of weighted capacitors, and the sum of k+1 and m is equal to n, i.e., k+1+m=n, which is the number of bits (resolution) of the n-bit SAR ADC converter 30. For example, for a 10-bit SAR DAC, n=10, k=4 (even number), m=5 (odd number), and k+1+m=n. In the embodiment, the LSB capacitor array 304 and the MSB capacitor array have the same number of capacitors.

In one embodiment, in the event that the n-bit SAR DAC converter 30 has an odd number of bits, k represents an odd number, and m represents an even number. The LSB capacitor array 304 has an even numbered k+1 of weighted capacitors and the MSB capacitor array has an even numbered m of weighted capacitors, and the sum of k+1 and m is equal to n, i.e., k+1+m=n, which the number of bits of the n-bit SAR ADC converter 30. For example, for a 11-bit SAR DAC, n=11, k=5 (an odd number), m=5 (odd number), and k+1+m=n.

In this embodiment, the variables k and m may be determined by the following equations:
m=n/2, and k=n−1−m if n is an even integer number,
m=(n−1)/2, and k=n−1−m if n is an odd integer number.

For example, for n=10 (an even integer number), m=10/2=5, and k=10−1−5=4. For n=11 (an odd integer number), m=(11−1)/2=5, and k=11−1−5=5.

The embodiment has the advantage of significantly reduced input capacitance during the sampling phase. It can be shown that the total input capacitance is $2^m$ C where m is the number of weighted capacitors in the MSB capacitor array 305. For example, when the numbers of k+1 and m are chosen to be the same, then the total input capacitance, the silicon area, and the ratio between the largest capacitor and the unit capacitor can be reduced drastically.

The n-bit SAR ADC converter 30 further includes a plurality of switches S0, S1, . . . , Sk, Sk+1, . . . , Sm, that control the positions of the respective capacitors in the LSB capacitor array 304 and in the MSB capacitor array 305. In one embodiment, during the sample phase, the capacitors C0 to Ck are grounded, and the capacitors Ck+1 to Ck+m are coupled to the analog input signal Vin. During the hold and conversion phase, the capacitors C0 to Ck are coupled to a weighted version of the reference voltage Vref. The embodiment is advantageous because the total input capacitance is equal to $2^m$ C instead of the $2^n$ C of the SAR DAC 20 of FIG. 2.

The weighted capacitors can be implemented, e.g., as poly-poly capacitors, MOS capacitors (also referred to as diffusion-poly capacitors), metal-poly capacitors, and metal-metal capacitors. However, the implementation is sensitive to parasitic capacitance in node A and between node A and node B, which may cause non-linearity in the DAC array, which, in turn, affects the differential non-linearity (DNL) of the SAR ADC 30. Further, the matching between the coupling capacitor Cc and the unit capacitor C0 presents huge challenges as these two capacitors are implemented differently. Whereas the C0 capacitor is grounded, the coupling capacitor Cc is floating between the node A and the node B. This is especially a problem for high-resolution SAR DACs, i.e., the capacitor arrays in the DAC have a large number of capacitors. In some embodiments, the coupling capacitor Cc may be trimmed. Some trim solutions are in common use. For example, one such solution is the laser cutting that can be performed on the die. However, the trimming of a small size of the coupling capacitor Cc is challenging. In addition, the trimming problem is further aggravated by the fact that the coupling capacitor CC is a floating capacitor.

Figure 4:
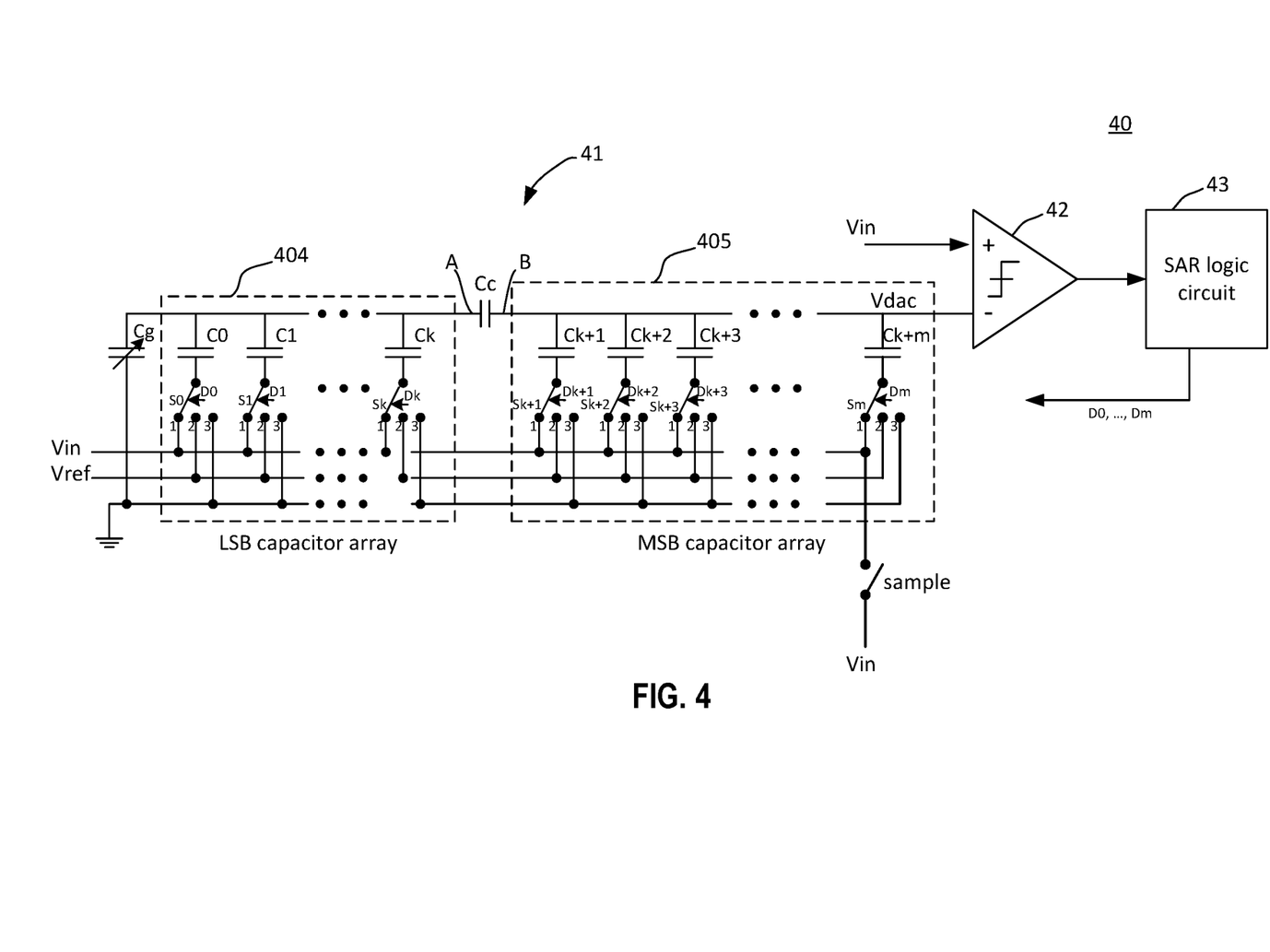
FIG. 4 is a block diagram of an n-bit SAR ADC converter according to an embodiment of the present invention.

FIG. 4 is a block diagram of an n-bit SAR ADC converter 40 according to an embodiment of the present invention. Referring to FIG. 4, the n-bit SAR ADC converter 40 includes a capacitor array DAC 41, a comparator 42, and a SAR logic circuit 43. The capacitor array DAC 41 includes an LSB capacitor array 404 having a number k+1 (0 to k) of capacitors and an MSB capacitor array 405 having a number m (k+1 to m+k) of capacitors, wherein k and m are integers, and the sum of k+1 and m is equal to n (the resolution of the ADC converter), i.e., k+1+m=n, which is the number of bits of the n-bit SAR ADC converter 40. The k+1 capacitors (C0, C1, . . . , Ck) of the LSB capacitor array 403 are binary weighted, and each of which has an end coupled to a node A. The m capacitors (Ck+1, Ck+2, . . . , Ck+m) are binary weighted and each of which has an end coupled to a node B. The n-bit SAR ADC converter 40 also includes a coupling capacitor Cc disposed between the node A and the node B. The n-bit SAR ADC converter 40 further includes a plurality of switches S0, S1, . . . , Sk, Sk+1, . . . , Sm, that control the positions of the respective capacitors in the LSB capacitor array 404 and in the MSB capacitor array 405. In one embodiment, during the sample phase, the capacitors C0 to Ck are grounded, and the capacitors Ck+1 to Ck+m are coupled to the analog input signal Vin. During the hold and conversion phase, the capacitors C0 to Ck are coupled to a weighted version of the reference voltage Vref.

As explained above, it is technically difficult to trim the coupling capacitor Cc to have the same value as that of the capacitor C0 because the coupling capacitor Cc is a floating capacitor between the node A and the node B, whereas the capacitor C0 is coupled between either the input signal Vin, the reference voltage Vref, or the ground potential. Referring to FIG. 4, the n-bit SAR ADC converter 40 also includes a grounded capacitor Cg coupled between the node A and the ground potential and configured to form together with the coupling capacitor Cc a capacitor structure that has a capacitance value equal to that of the capacitor Co, i.e., the unit capacitance value C. Trimming the grounded capacitor Cg is much easier than trimming Cc because the capacitor Cg is a grounded capacitor. The sensitivity of the linearity of the SAR DAC for variations of Cg is significantly lower than the sensitivity of the same linearity for variations of Cc. For example, for a 5-bit LSB capacitor array, a change of capacitance value of Cg in 0.32 C steps corresponds to a change of the capacitance value of Cc by 0.01 C. The change in steps of 0.32 C can be much easier implemented than the change in steps of 0.01 C.

Taking an example of a 10-bit SAR DAC converter, i.e., k+1=5, m=5. In the ideal case, Vin=0 or Vref, Cc=Co, and Cg=0, the ideal output voltage value $V_{ideal}$ of a digital input code "i" of the DAC is:

$$V_{ideal} = \frac{2^i}{1024-1} \times \Delta V \quad (1)$$

where $\Delta V$ is the step size (1LSB).

In the real case where Cc is not equal to Co (Cc≠Co), i.e., Cc=Co(1+ε) and let Cg≠0, the real output voltage value $V_{real}$ corresponding to the digital input code "i" is:

$$V_{real} = \frac{2^i \times 32Co}{1023 \times Co + Cg} \times \frac{Cc}{Cc + 31Co} \times \Delta v \quad (2)$$

Target: find the value Cg to obtain a linear output value $V_{linear}$ versus all possible digital input codes. The condition to obtain perfect linearity is Videal=Vreal. That is:

$$V_{ideal} = \frac{2^i}{1024-1} \times \Delta V = \frac{2^i \times 32Co}{1023 \times Co + Cg} \times \frac{Cc}{Cc + 31Co} \times \Delta v \quad (3)$$

Or Cg≈×Co×ε. (3)

If the error ε is 0.1, Cg=3.1×Co.

The sensitivity of the output voltage in relation to the grounded capacitor Cg is calculated by the following equation:

$$S_{Cg}^v = \frac{dV}{dCg} \times \frac{Cg}{v} \quad (4)$$
$$= \frac{-(Cg + 31Co) \times Cg}{(31Co + Cg)(Cc + 31Co) + 31CoCc}$$

The sensitivity of the output voltage in relation to the coupling capacitor Cc is calculated by the following equation:

$$S_{Cc}^v = \frac{dV}{dCc} \times \frac{Cc}{v} \quad (5)$$
$$= \frac{+(Cg + 31Co) \times 31Co}{(31Co + Cg)(Cc + 31Co) + 31CoCc}$$

The ratio between the two sensitivities is:

$$= > \frac{S_{Cc}^v}{S_{Cg}^v} = \frac{31Co}{Cg} \gg 1 \quad (6)$$

Thus, the sensitivity of the linearity of the SAR DAC for variations of the grounded capacitor Cg is significantly lower than the sensitivity of the same linearity for variations of the coupling capacitor Cc.

Figure 5:
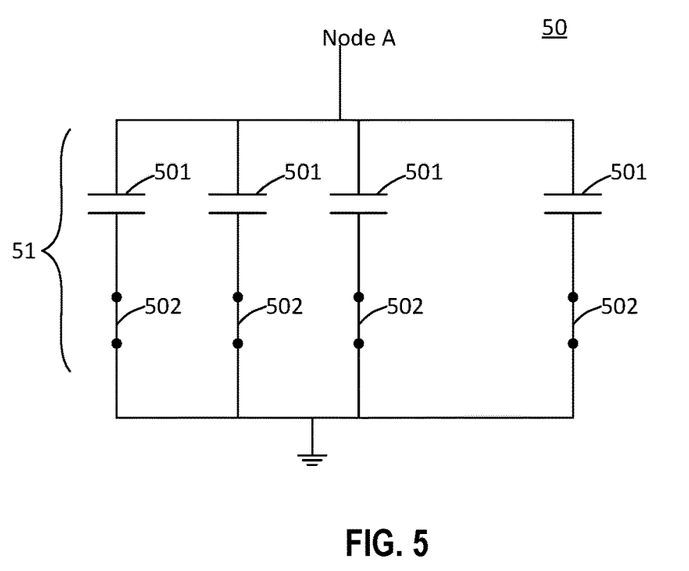
FIG. 5 is a schematic diagram of a trim capacitor that can be used as a grounded capacitor in FIG. 4 according to an embodiment of the present invention.

FIG. 5 is a schematic diagram of a trim capacitor 50 that can be used as a grounded capacitor Cg in FIG. 4 according to an embodiment of the present invention. As shown in FIG. 5, the trim capacitor 50 includes a plurality of branches 51 connected in parallel, each branch 51 includes a capacitor 501 and a link element 502 connected in series between the node A and the ground potential. In one embodiment, each capacitor 501 may have a capacitance value of $2^k$ C/10, where k+1 is the number of capacitors in the LSB capacitor array. In one embodiment, the link element 502 may be a thin film made of a polysilicon or metal material that can be cut open using a laser beam. In another embodiment, the link element 502 may be a fuse that can be blown by flowing an electric current through it. For example, if it is desired to stepwise linearly calibrate the coupling capacitor Cc in steps of 0.01 C in the range of 0.05 C, the trim capacitor 50 (i.e., the grounded capacitor Cg) will have five branches 51, each capacitor of the branch will have a capacitance value of 0.32 C. In yet another embodiment, the link element 502 may be an on-chip electronic switch, such as an MOS transistor, a transmission gate, and the like.

Figure 6:
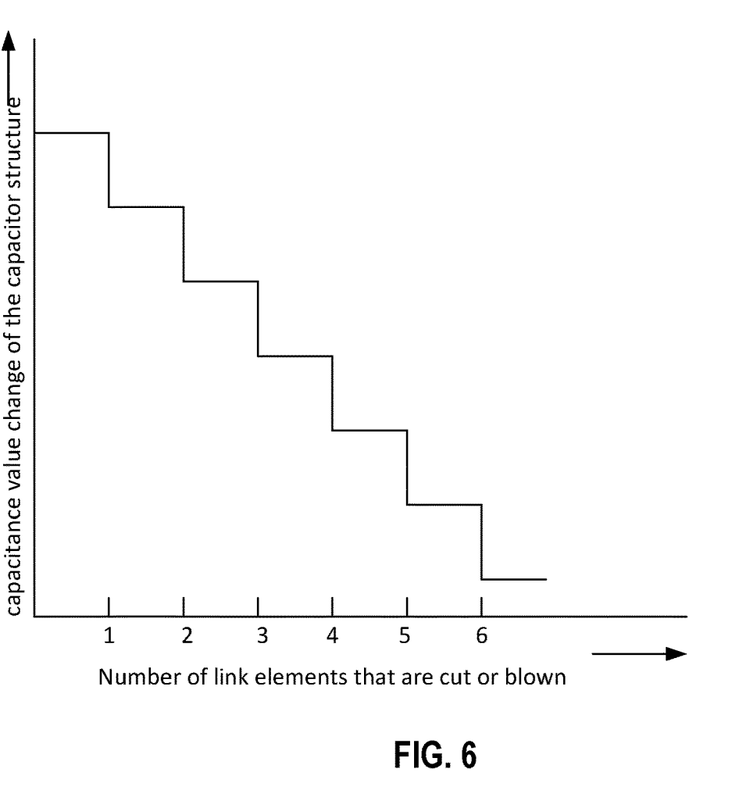
FIG. 6 is a graph of the change in capacitance values of the capacitance structure that is a combination of the coupling capacitance Cc and the grounded capacitance Cg according to an embodiment of the present invention.

FIG. 6 is a graph of the change in capacitance values of the capacitance structure that is the combination of the coupling capacitance Cc and the grounded capacitance Cg according to an embodiment of the present invention. The x-axis represents the number of capacitors 501 that are disconnected from the ground potential, i.e., the link element 502 has been cut open or blown. The y-axis represents the capacitance value change of the capacitor structure that is the combination of the coupling capacitance Cc and the grounded capacitance Cg (the trim capacitor 50).

Figure 7:
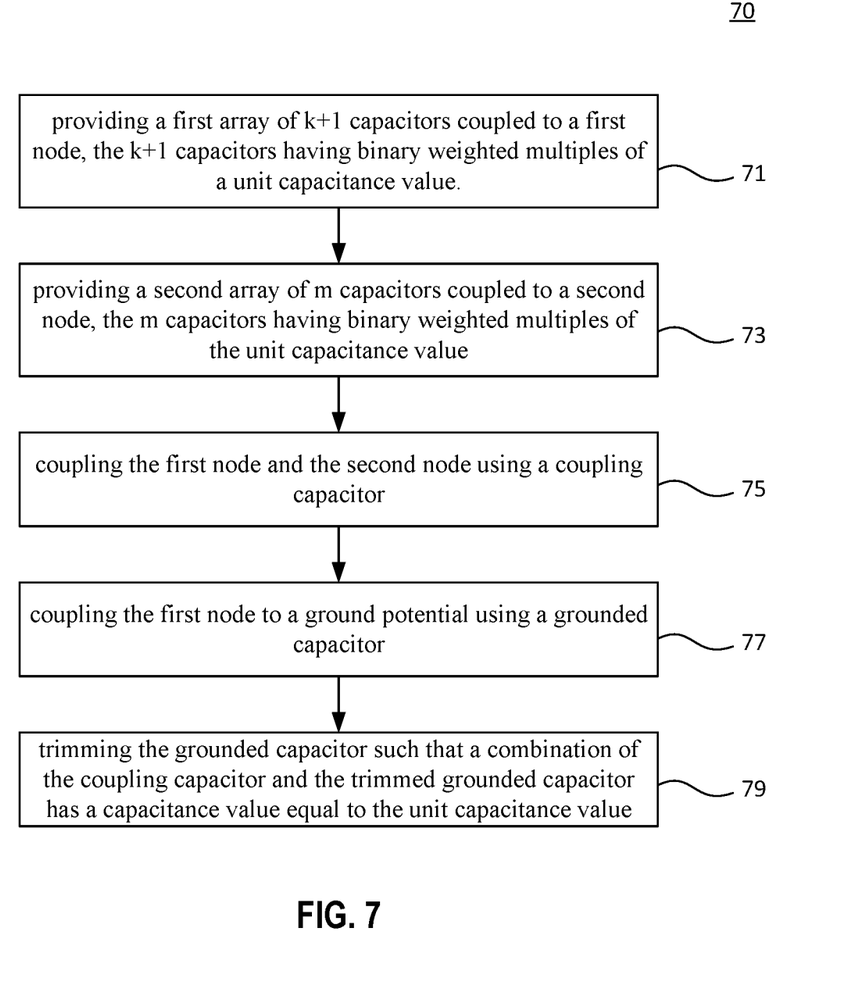
FIG. 7 is a flowchart illustrating a method for providing analog-to-digital conversion according to an embodiment of the present invention.

FIG. 7 is a flowchart illustrating a method 70 for providing analog-to-digital conversion having an n-bit digital output signals according to an embodiment of the present invention. The method 70 includes an n-bit successive approximation register ADC such as the SAR ADC 40. Those of skill in the art will appreciate that the order in which the method is described is not intended to be construed as a limitation, and any number of the described blocks can be combined in any order to implement the method.

The method 70 may include, at block 71, providing a first array of k+1 capacitors coupled to a first node, the k+1 capacitors having binary weighted multiples of a unit capacitance value.

At block 73, the method 70 includes providing a second array of m capacitors coupled to a second node, the m capacitors having binary weighted multiples of the unit capacitance value. In one embodiment, the variables k, m, and n are integers, and the sum of k+1 and m is equal to n. In one embodiment, k+1=m if n is an even number. In another embodiment, k=m if n is an odd number.

At block 75, the method 70 includes coupling the first node and the second node using a coupling capacitor.

At block 77, the method 70 includes coupling the first node to a ground potential using a grounded capacitor.

At block 79, the method 70 includes trimming the grounded capacitor such that a combination of the coupling capacitor and the trimmed grounded capacitor has a capacitance value equal to the unit capacitance value.

In one embodiment, trimming the grounded capacitor may be performed by applying a n-bit digital input signal Dn corresponding to a known analog voltage signal to the capacitor array DAC 41 to control the position of the switches. The capacitor array 41 will generate an analog output signal Vdac in response to the digital input signal Dn. The analog output signal Vdac is then compared with the known analog voltage signal by an analog comparator, which generates a difference voltage at its output. The difference voltage is then converted to a digital signal to be used to trim (e.g., laser cut or blow a fuse) the grounded capacitor Cg.

Figure 8:
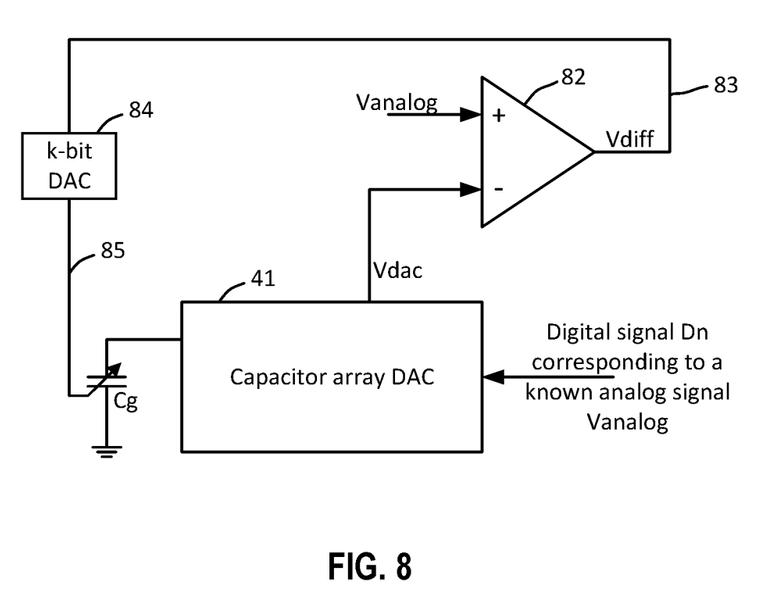
FIG. 8 is a simplified block diagram illustrating a methodology for trimming the grounded capacitance Cg according to an embodiment of the present invention.

FIG. 8 is a simplified block diagram illustrating a methodology for trimming the grounded capacitance Cg according to an embodiment of the present invention. Referring to FIG. 8, an external digital signal code Dn corresponding to a known analog signal value is applied to the capacitor array DAC 41. The capacitor array DAC 41 then generates an analog output signal Vdac in response to the digital signal code Dn. A comparator 82 compares the analog output signal Vdac with the known analog signal Vanalog and provides a difference voltage Vdiff 83. A k-bit analog-to-digital converter (ADC) 84 converts the difference voltage Vdiff 83 to a k-bit digital signal 85 that is used to trim the grounded capacitor Cg.

While the present invention is described herein with reference to illustrative embodiments, this description is not intended to be construed in a limiting sense. Rather, the purpose of the illustrative embodiments is to make the spirit of the present invention be better understood by those skilled in the art. In order not to obscure the scope of the invention, many details of well-known processes and manufacturing techniques are omitted. Various modifications of the illustrative embodiments, as well as other embodiments, will be apparent to those of skill in the art upon reference to the description. It is therefore intended that the appended claims encompass any such modifications.

Furthermore, some of the features of the preferred embodiments of the present invention could be used to advantage without the corresponding use of other features. As such, the foregoing description should be considered as merely illustrative of the principles of the invention, and not in limitation thereof. Those of skill in the art will appreciate variations of the above-described embodiments that fall within the scope of the invention. As a result, the invention is not limited to the specific embodiments and illustrations discussed above, but by the following claims and their equivalents.

What is claimed is:

1. An array of capacitors, comprising:
    a first array of k capacitors coupled to a first node and having capacitances which are binary weighted multiples of a unit capacitance value;
    a second array of m capacitors coupled to a second node and having capacitances which are binary weighted multiples of the unit capacitance value;
    a coupling capacitor disposed between the first node and the second node; and
    a grounded capacitor coupled between the first node and a ground potential, the grounded capacitor comprising a plurality of capacitors coupled in parallel between the first node and the ground potential, wherein
    the coupling capacitor and the grounded capacitor together form a capacitor structure having the unit capacitance value.

2. The array of capacitors of claim 1, wherein the plurality of capacitors each are coupled to the ground potential through a plurality of link elements.

3. The array of capacitors of claim 2, wherein the plurality of link elements comprise laser cuttable films or integrated electronic switches.

4. The array of capacitors of claim 2, wherein the plurality of link elements comprise electrically blowable fuses or integrated electronic switches.

5. The array of capacitors of claim 2, wherein the plurality of link elements comprise on-chip electronic switches.

6. An n-bit analog-to-digital converter (ADC), comprising:
    an array of capacitors configured to receive an analog input signal and output an analog output signal;
    a comparator coupled to the array of capacitors and configured to provide a digital comparison result in response to the analog output signal;

a successive approximation register (SAR) logic circuit configured to receive the digital comparison result and provide a plurality of digital data signals to the array of capacitors, wherein the array of capacitors comprises:

a first array of k+1 capacitors coupled to a first node and having capacitances which are binary weighted multiples of a unit capacitance value;

a second array of m capacitors coupled to a second node and having capacitances which are binary weighted multiples of the unit capacitance value;

a coupling capacitor disposed between the first node and the second node; and a grounded capacitor coupled between the first node and a ground potential;

wherein k, m, and n are integers, and k+1+m=n; and the grounded capacitor comprises a plurality of capacitors coupled in parallel between the first node and the ground potential.

7. The n-bit analog-to-digital converter of claim 6, wherein the coupling capacitor and the grounded capacitor together form a capacitor structure having the unit capacitance value.

8. The n-bit analog-to-digital converter of claim 6, wherein the plurality of capacitors each are coupled to the ground potential through a plurality of link elements.

9. The n-bit analog-to-digital converter of claim 8, wherein the plurality of link elements comprise laser cuttable films, electrically blowable fuses, or on-chip electronic switches.

10. A method of analog-to-digital signal conversion, the method comprising:

providing a first array of k capacitors coupled to a first node and having capacitances which are binary weighted multiples of a unit capacitance value;

providing a second array of m capacitors coupled to a second node and having capacitances which are binary weighted multiple of the unit capacitance value;

coupling the first node and the second node by a coupling capacitor;

coupling the first node to a ground potential by a ground capacitor; and trimming the grounded capacitor so that a combination of the coupling capacitor and the trimmed grounded capacitor has a capacitance value equal to the unit capacitance value, wherein trimming the grounded capacitor comprises a plurality of capacitors coupled in parallel between the first node and the ground potential.

11. The method of claim 10, wherein the plurality of capacitors each are coupled to the ground potential through a plurality of link elements.

12. The method of claim 11, wherein the plurality of link elements comprises laser cuttable films, and trimming the grounded capacitor comprises cutting the films using a laser beam.

13. The method of claim 11, wherein the plurality of link elements comprises electrically blowable fuses, and trimming the grounded capacitor comprises applying an electric current to blow the fuses.

* * * * *